United States Patent [19]
Kraft

[11] Patent Number: 4,809,360
[45] Date of Patent: Feb. 28, 1989

[54] ELECTRONIC EQUIPMENT REMOTE CONTROL UNIT CHASSIS

[75] Inventor: James L. Kraft, Minneapolis, Minn.

[73] Assignee: Collage Video Specialities, Inc., Minneapolis, Minn.

[21] Appl. No.: 106,613

[22] Filed: Oct. 6, 1987

[51] Int. Cl.$^4$ .......................... H04B 9/00; H04B 1/08
[52] U.S. Cl. .................................. 455/603; 455/618; 455/128; 455/151; 358/194.1; 340/696; 361/391; 361/394; 361/395
[58] Field of Search ............... 455/603, 618, 620, 600, 455/92, 106, 117, 128, 151; 340/696; 358/194.1; 312/223; 361/391, 392, 393, 394, 395, 396, 399

[56] References Cited

U.S. PATENT DOCUMENTS

| | | | |
|---|---|---|---|
| 4,709,405 | 11/1987 | Okazaki | 455/603 |
| 4,709,412 | 11/1987 | Seymour et al. | 340/696 |
| 4,768,230 | 8/1988 | Viebrantz et al. | 455/603 |

FOREIGN PATENT DOCUMENTS 0210777  11/1984  Japan .................................. 358/194.1

*Primary Examiner*—Robert L. Griffin
*Assistant Examiner*—Andrew J. Telesz, Jr.
*Attorney, Agent, or Firm*—Lawrence M. Nawrocki

[57] ABSTRACT

An apparatus for housing a plurality of remote control units wherein the units are consolidated at a common location and wherein the units are protected from damage which may be occasioned upon them. Each housing is defined by a wall having a window formed therein and a drawer for mounting a unit therewithin whereby an infrared emitter of a remote control unit is disposed so that it will project an infrared signal through the window. Further, the housings include hook and notch arrangements for mating the plurality of housings together whereby each transmission path from a remote control through the corresponding window to electronic equipment is rendered unobstructed.

6 Claims, 1 Drawing Sheet

U.S. Patent  Feb. 28, 1989  4,809,360
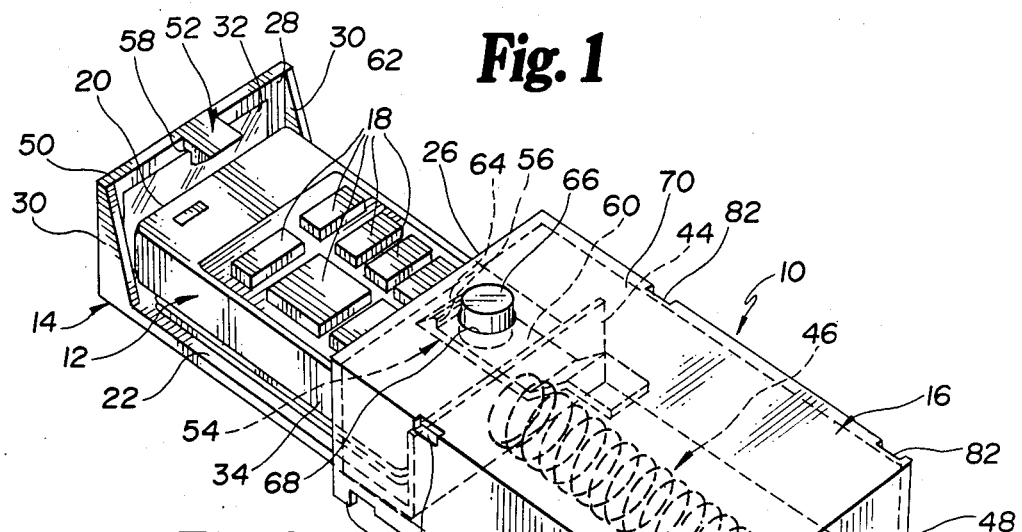
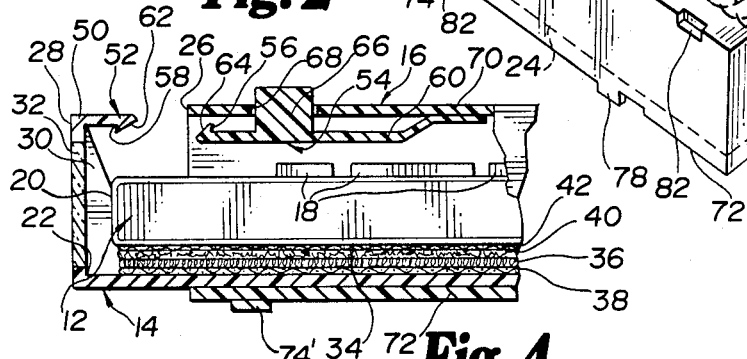
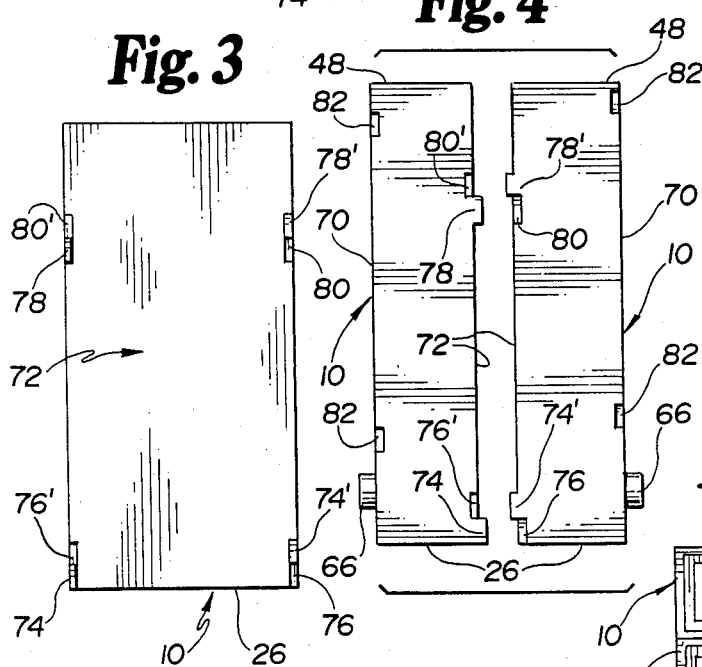
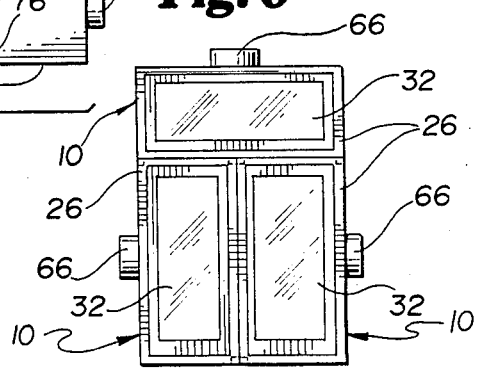

2

ELECTRONIC EQUIPMENT REMOTE CONTROL UNIT CHASSIS

TECHNICAL FIELD

The present invention deals broadly with structures for housing a plurality of items to be stored and maintained at a common location. More specifically, however, the invention is directed to apparatus for mounting a plurality of electronic equipment remote control units to consolidate them at a common location. The apparatus further functions to protect the remote control units from damage.

BACKGROUND OF THE INVENTION

World entertainment habits were changed dramatically with the advent of the television in the latter part of the first half of the twentieth century. Prior to the availability of commercial television, the primary electrical/electronic sources of entertainment were provided by radio and movies. In the case of the latter medium, it was necessary for a person to leave his home to avail himself of the entertainment. For this reason, therefore, television had particular appeal.

As the decades since the emergence of television have passed, television has retained its appeal, although the percentage of favor of the various media has fluctuated from time to time. with the advent of the VCR (video cassette recorder), however, new interest in television as a source of entertainment has arisen. It has enabled the best of two or more worlds to be realized. Not only is commercial network television programming available, but first-run movies can now also be viewed in the privacy and relaxing atmosphere of one's home.

As the television has matured, controls and controlling equipment have become more sophisticated. Television remote control units have been made available to the consuming public. Such units enable channel changing and other adjustments to be made by a viewer while the viewer remains comfortable in his favorite recliner or arm chair.

Similarly, VCR's and other similar equipments can also be "fitted" with their respective remote control units. Not only a television unit which a viewer employs to watch a video tape, but also the tape player can be controlled remotely from the comfort of a chair across the room.

Consequently, a situation known as "coffee table clutter" has arisen. Research generated by the General Electric Company and RCA indicates that more than 2.5 households have at least three remote control accessories for controlling different equipments. The same research reflects that in excess of ten million households have at least two remote units. As can be seen, therefore, proliferation of remotes in any particular household can be common.

Various attempts have been made to rectify this problem. All attempts to date, however, have focused in one area. The offered solution has been a single unified, or universal, remote controller. Such an accessory goes far to provide a solution to the problem of "coffee table clutter". Such devices enable virtually every infrared, remote controller-operated audio and video component in a home to be brought under the operation of a single device.

Various manufacturers have recognized the problem discussed hereinbefore and have developed a universal accessory for controlling televisions, VCR's, compact disc players, etc. these companies include General Electric, Magnavox, Onkyo, Sanyo, and others.

Still, problems remain. For example, such universal remote control apparatus tend to be expensive. The least expensive tend to be marketed at a price of at least $100. Units of this type are, typically, sold at a price in a range between $100 and $150. It is envisioned that, as sophistication gets greater, costs will increase even more.

This cost investment in an expensive piece of equipment seems particularly avoidable and wasteful in view of the fact that the owner of the various electronic equipments still has a plurality of remotes which operate individual equipments. He is confronted with the decision whether to save the remote control units into a unitary assembly to eliminate the problems associated with plural accessories.

SUMMARY OF THE INVENTION

The present invention is a chassis for consolidating a plurality of electronic remote control units at a common location and for protecting those units from damage which might be occasioned upon them. It includes a plurality of housings, each being defined by a wall having a window formed therein. Each housing corresponds to one of the remote control units with which the the invention is intended to be used. Each housing, in turn, includes means for mounting the corresponding remote control unit therewithin. The control unit is mounted immobilely within the housing to orient the unit with an infrared emitter thereof, disposed so that it will project an infrared signal through the window to control an electronic equipment with which the control unit is associated. Further, the chassis includes means for mating the individual housings together so that each infrared transmission path from a window of a housing to the electronic equipment associated with the particular remote control unit is able to be rendered unobstructed.

In a preferred embodiment, each housing includes a drawer having a closure plate which functions, along with the housing wall, to completely enclose the particular remote control unit within the housing when the drawer is closed. In this embodiment, the window is formed within the closure plate, and the control unit is, when the drawer is opened, mounted therewithin with the infrared emitter proximate the window.

It is envisioned that the drawer would be biased to an extended position so that, when a latch, normally holding the drawer in a retracted position, is released, the drawer would move to its extended position. Opening of the drawer for inserting of the control unit is, thereby, facilitated.

The control unit can be secured within the drawer by employment of hook and pile material laminae layers. One of the hook and pile layers would be secured to a floor of the drawer, and the other would be secured to the remote to be received within the particular housing. The unit can, thereby, be maintained immobilely within the drawer, and, when the drawer is shut and latched, the control unit becomes fixedly held within its corresponding housing.

Prongs and corresponding slots to receive the prongs can be provided at appropriate locations on the various housings. Prongs carried by one housing can, thereby, be received in the slots in a second housing to which the first is to be mated to effect retention of one housing to another.

The slots and prongs can be provided at locations so that mating can be effected in a number of configurations. For example, two similarly sized and shaped housings might be provided with prongs and slots in particular locations so that they can be mated together bottom-to-bottom with corresponding opposite front and rear edges flush with one another.

Additionally, prongs and slots could be provided so that a third of such units could be mated end-on to the two bottom-to-bottom mated housings.

The present invention is, thus, a device for solving many of the problems existant in the prior art. More specific features and advantages obtained in view of those features will become apparent with reference to the DETAILED DESCRIPTION OF THE INVENTION, appended claims, and accompanying drawing figures.

BRIEF DESCRIPTION OF THE DRAWING

FIG. 1 is a perspective view of a single housing in accordance with the apparatus of the present invention with a drawer thereof opened to receive a remote control unit therein;

FIG. 2 is a side elevational, fragmentary view of the housing of FIG. 1, some portions thereof being cut away;

FIG. 3 is a bottom plan view of the housing of FIG. 1;

FIG. 4 is a side elevational view of a pair of housings turned bottom-to-bottom preparatory to their being joined together with latch release mechanisms facing in opposing directions;

FIG. 5 is a view similar to FIG. 4, but with the bottom of one housing over the top of the other housing; and FIG. 6 is a front elevational view of three housings joined together, two of the housings being mated together bottom-to-bottom, and a third being mated end-on to a bottom-to-bottom mated pair.

DETAILED DESCRIPTION OF THE INVENTION

Referring now to the drawing wherein like reference numerals denote like elements throughout the several views, FIG. 1 illustrates a housing 10 in accordance with the apparatus of the present invention having a remote control unit 12 received within a drawer 14 disposed for extention from, and insertion within, a wall 16 generally defining the housing 10. The remote control unit 12 is of a type known in the prior art and, typically, has a plurality of control buttons 18 for effecting the on/off function, channel changing, etc. Such a unit 12 has an infrared emitter (not shown) at a forward end thereof 20. An infrared signal transmitted by the unit 12 and emitted by the emitter "illuminates" the equipment intended to be controlled (not shown), and the transmitted signal is representative of the function button of the control unit 12 which is pushed.

The housing defining wall 16 is shaped similarly to the remote control unit 12 intended to be receive therewithin, but it is somewhat larger so that the unit 12 can be placed in the drawer 14 of the housing 10 when the drawer 14 is in an extended position, and, when the unit 12 is maintained in a particular position, it can be held such that, when the drawer 14 is inserted back into the wall 16 of the housing 10, the control unit casing can be maintained spaced from the housing wall 16.

The floor 22 of the drawer 14 is substantially planar and is dimensioned so that it can be received within the wall 16 and ride reciprocally on a track 24 within the housing 10 to effect extension and retraction of the drawer 14 through an open forward end 26 of the housing wall 16. The drawer 14 has an upturned forward end defining a closure plate 28 which occludes the open forward end 26 of the housing wall 16 when the drawer 14 is closed. The closure plate 28 can be strengthened in an orientation generally perpendicular to the floor 22 of the drawer 14 by means of a pair of buttresses 30, one at each lateral edge of the closure plate 28. A window 32 is provided in the closure plate 28, and, when the forward end 20 of the control unit 12 is disposed proximate the window 32, infrared transmissions emitted by the control unit 12 can pass through the window 32 to the equipment intended to be controlled. The control unit 12, therefore, need not be removed from the drawer 14 in which it has been received in order for it to accomplish controlling of a particular function of the electronic equipment.

As previously mentioned, a control unit 12 can be maintained in a defined position within the drawer 14. This can be accomplished by employment of hook/pile material such as VELCRO ®. One of the hook and pile laminae can be applied to the floor 22 of the drawer 14 and the other of the laminae can be applied to a bottom side 34 of the control unit 12. FIG. 2 illustrates the hook lamina 36 applied to the floor 22 by means of an adhesive 38 and the pile lamina 40 applied to the bottom side 34 of the control unit 12, also by means of an adhesive 42.

Referring again to FIG. 1, a rearward end of the drawer is also upturned, and this upturned panel 44 functions as an abutment. A compression spring 46 can be maintained so that one end thereof is in engagement with the abutment defined by panel 44 and the other is in engagement with a rear wall 48 of the housing 10. Means (not shown) can be utilized to maintain the compression spring 46 in a desired location relative to the abutment and the rear wall 48 of the housing 10.

The compression spring 46 functions to bias the drawer 14 to a position extended from the housing defining wall 16. If desired, a stop (not shown) can be provided to preclude complete departure of the drawer 14 from the housing 10. The position of the drawer 14 illustrated in FIG. 1 is one which the drawer 14 would occupy when the control unit 12 is being placed within the housing 10 or when the control unit 12 is being manipulated to effect change of a function of the controlled electronic equipment.

When a control unit 12 is not being utilized and has already been immobilized within the drawer 14 in which it has been accepted, the drawer 14 can be urged to a retracted position wherein the closure plate 28 occludes the opening of the front end 26 of the housing 10. An upper edge 50 of the closure plate 28 can be provided by a strike 52 to effect maintenance of the drawer 14 i the retracted position. A latch 54 having a shoulder 56 engageable with the shoulder 58 of the strike 52 can be provided to hold the strike 52 and, therefore, the drawer 14 against extension. The latch 54 can be munted on a leaf spring-type mounting structure 60 so that it is resiliently maintained in a position wherein latching is accomplished. Surfaces 62, 64 of the strike 52 and latch 54 which first engage as the drawer 14 is closed can be ramped so that, as the strike 52 moves rearwardly into the wall 16 defining the housing 10, the latch 54 will be urged downwardly until the shoulder 56 of the latch 54 passes the shoulder 58 of the strike 52.

With the latch 54 in an engaged position, the drawer 14 will be held in its retracted position. Unlatching can be effected by a button 66 extending generally transversely with respect to the leaf spring and through an aperture 68 in the upper wall 70 of the housing 10. When it is desired that the drawer 14 to be opened, the user of the invention merely need press the button 66 to disengage the shoulder 56 of the latch 54 from the shoulder 58 of the strike 52. With the leaf spring-mounted latch 54 urged downwardly in response to the pushing of the button 66, the compression spring 46 will act to urge the drawer 14 outwardly to the extended position thereof.

FIG. 3 shows the bottom 72 of a housing 10 and the arrangement of notches and prongs which enables the mating together of two housings 10 in a bottom-to-bottom relationship. The lower left corner of the bottom wall 72 of the housing 10, as viewed in the figure, is provided with a prong 74 extending generally perpendicular to that bottom wall 72. The lower right corner of the bottom wall 72 of the housing, as viewed in the figure, is provided with a notch 76 sized and shaped to receive the prong 74.

A similar prong/notch combination 74', 76' is provided at the bottom wall 72 of the housing 10 at a distance offset slightly along an axis of elongation of the housing 10. This prong/notch pair 74', 76', however, is reversed with respect to the first pair. That is, the prong 74' is on the opposite side of the housing 10 from the first prong 74, as is the notch 76' on the opposite side of the housing 10 from the first notch 76.

Similar combinations of prong/notch pairs 78, 78', 80, 80' are provided along opposite lateral edges of the bottom wall 72 of the housing 10 at a location proximate the opposite end of the housing 10. As will be able to be seen then, the bottom wall 72 of each housing 10 has a prong, extending generally prependicular to the bottom wall 72, proximate each corner thereof. Similarly, a corresponding notch is also provided proximate each corner of the bottom wall 72. Thus, a pair of housing 10 will be able to be mated together in a bottom-to-bottom configuration as suggested in FIG. 4.

As seen in FIG. 4, because of the positioning of prongs and notches as described, when a pair of housings are mated together, corresponding opposite ends of the housings will be flush with one another. Additionally, as will be able to be seen in view of this disclosure, a housing 10 can be "universal". That is, each housing 10 can be manufactured identical to the others, and different molds need not be provided and used, depending upon the intended application of a particular housing to be manufactured.

FIG. 5 illustrates a pair of housings 10 approaching mating in a top-to-bottom configuration. In order to effect such mating, notches 82 are provided in the top wall 70 of the housing 10 at relative locations so that they can accept the prongs extending from the bottom wall 72 as previously described. These notches 82, however, would be displaced along an axis of elongation of the housing 10 so that, when mating is effected, the housing 10 whose bottom is mated to the top of the other housing would not obstruct the button 66 for unlatching the drawer 14 of the lower housing.

FIG. 6 illustrates a configuration wherein three housings are mated together. Notches (not shown) can be provided, if desired, in the side walls of the various housings to accept the prongs previously described, the notches being provided at appropriate locations along an axis of elongation so that opposite longitudinal ends of the three housings can all be flush with one another.

With the prong/notch arrangement that has been described and which is illustrated in the drawing figures, housings will be mateable together with the windows 32 in the closure plates 28 facing in the same direction. This is particularly illustrated in FIG. 6. It will be understood, however, that it is within the scope of the invention to employ other prong/notch arrangements wherein windows could face in opposite directions.

Numerous characteristics and advantages of the invention covered by this document have been set forth in the foregoing description. It will be understood, however, that this disclosure is, in many respects, only illustrative. Changes may be made in details, particularly in matters of shape, size, and arrangement of parts without exceeding the scope of the invention. The invention's scope is, of course, defined in the language in which the appended claims are expressed.

What is claimed is:

1. Apparatus for protecting a plurality of electronic equipment remote control units from damage and consolidating the units at a common location, comprising:
   (a) a plurality of housings, one corresponding to each of the remote control units, each of said housing being defined by a wall having a window formed therein;
   (b) means for immobilely mounting each remote control unit in its corresponding housing, and orienting each unit with an infrared emitter thereof disposed to project an infrared signal through the window of its corresponding housing to control an associated electronic equipment; and
   (c) means for mating said housings together with each transmission path from a window of a housing mounting a remote control unit therein to the electronic equipment associated with the remote control unit able to be rendered unobstructed.

2. Apparatus in accordance with claim 1 wherein each of said housings comprises:
   (a) said wall defining said housing;
   (b) a drawer retractable into, and extendible from, said wall, said drawer having a closure plate;
   (c) means biasing said drawer to an extended position;
   (d) latch means for holding said drawer in a retracted position; and
   (e) latch release means.

3. Apparatus in accordance with claim 2 wherein said window is formed in said closure plate.

4. Apparatus in accordance with claim 3 wherein each of said mounting means comprises:
   (a) said latch means; and
   (b) material laminae having a hook layer and a pile layer, one of said layers being secured on a floor of said drawer, and the other of said layers being secured to a remote control unit to be received in the housing of which the drawer is a component, wherein said remote control unit can be positioned within said drawer with said hook and pile layers in overlying relationship.

5. Apparatus in accordance with claim 1 wherein said mating means comprises a plurality of prongs carried by, and a plurality of slots formed in, each of said housings, said prongs and slots being positioned with respect to their respective housings so that prongs carried by one housing can be received in slots formed in a second housing to hold the two housings together.

6. Apparatus in accordance with claim 5 wherein said prongs and slots are positioned with respect to their respective housings so that one housing can be held together with another housing in different configurations.

* * * * *